US006424576B1

(12) United States Patent
Antosh et al.

(10) Patent No.: US 6,424,576 B1
(45) Date of Patent: Jul. 23, 2002

(54) APPARATUS AND METHODS FOR SELECTIVELY DISABLING OUTPUTS IN INTEGRATED CIRCUIT DEVICES

(75) Inventors: Jeffrey Antosh, Nampa; Rex Jackson, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/801,960

(22) Filed: Mar. 8, 2001

(51) Int. Cl.[7] .................................................. G11C 7/00
(52) U.S. Cl. .................... 365/189.05; 365/195; 365/201
(58) Field of Search ............................ 365/189.05, 201, 365/195

(56) References Cited

U.S. PATENT DOCUMENTS

| | | | | |
|---|---|---|---|---|
| 5,235,549 A | * | 8/1993 | Young et al. | 365/201 |
| 5,383,157 A | * | 1/1995 | Phelan | 365/201 |
| 5,758,063 A | | 5/1998 | Lindsay et al. | 395/183.17 |
| 5,930,188 A | | 7/1999 | Roohparvar | 365/201 |
| 5,986,944 A | * | 11/1999 | Merritt | 365/189.09 |
| 6,058,055 A | | 5/2000 | Brunelle | 365/201 |
| 6,072,737 A | | 6/2000 | Morgan et al. | 365/201 |

* cited by examiner

Primary Examiner—Tan T. Nguyen
(74) Attorney, Agent, or Firm—Thomas W. Leffert; Fogg Slifer; Polglaze Leffert & Jay P.A.

(57) ABSTRACT

Output driver stages and operation modes for selectively disabling device outputs are adapted for use in integrated circuit devices and in the testing of such integrated circuit devices. A device output is disabled by disabling its associated output driver. A first control signal is generated that is indicative of whether an output driver should be responsive to a second control signal or disabled regardless of the second control signal. The first control signal may be provided directly to one or more output drivers. Alternatively, the first control signal may be combined with the second control signal. The first control signal may be common to all coupled output drivers or a separate first control signal may be provided for each output driver. Selective disabling of output drivers can be used to force a device time-out during testing. Selective disabling of output drivers can also be used to reduce device power requirements.

97 Claims, 8 Drawing Sheets

APPARATUS AND METHODS FOR SELECTIVELY DISABLING OUTPUTS IN INTEGRATED CIRCUIT DEVICES

TECHNICAL FIELD OF THE INVENTION

The present invention relates generally to output drivers and operation modes for integrated circuit devices, and in particular, the present invention relates to output drivers and operation modes to selectively disable outputs of an integrated circuit memory device.

BACKGROUND OF THE INVENTION

Electronic information handling or computer systems, whether large machines, microcomputers or small and simple digital processing devices, require memory for storing data and program instructions. Various memory systems have been developed over the years to address the evolving needs of information handling systems. One such memory system includes integrated circuit memory devices.

Integrated circuit memory devices are rapidly-accessible memory devices. In an integrated circuit memory device, the time required for storing and retrieving information generally is independent of the physical location of the information within the memory device. Integrated circuit memory devices typically store information in a large array of cells. Data and status information of the memory device are provided to external devices through a set of DQ or data lines.

Computer, communication and industrial applications are driving the demand for memory devices in a variety of electronic systems. One important form of integrated circuit memory device includes a non-volatile memory made up of floating-gate memory cells called flash memory. Computer applications use flash memory to store BIOS firmware. Peripheral devices such as printers store fonts and forms on flash memory. Digital cellular and wireless applications consume large quantities of flash memory and are continually pushing for lower voltages and higher densities. Portable applications such as digital cameras, audio recorders, personal digital assistants (PDAs) and test equipment use flash memory cards as the medium to store data, send and receive wireless faxes, and store digital audio clips and digital images. Each of these applications requires large amounts of highly reliable memory.

Memory devices are generally fabricated on semiconductor wafers. Each of these wafers typically contains a number of individual integrated circuit memory devices formed in rectangular areas known as dies. After fabrication, each die is separated, or diced, then packaged in a format suitable for the end user.

Before or after dicing and packaging, a manufacturer may test its integrated circuit devices as part of a quality program to improve end-use reliability. such tests are generally performed on highly-specialized testing systems or tester hardware. Prior to dicing, tests may be performed by the testing system on each die of a semiconductor wafer in pattern. The tester hardware may test each die individually or it may test multiple dies concurrently. Subsequent to dicing, tests may be performed by the testing system on multiple packaged components in pattern. The tester hardware may test each component individually or it may test multiple components concurrently. The die or component being tested is often referred to as a device under test (DUT).

In general, signals and potentials are applied to or received from the DUT through a set of leads often referred to as probes or contractors. These leads may be individually located to the appropriate landing pad or pin on the DUT or they may grouped as a part of a head, card or module used to locate multiple leads simultaneously.

Some memory devices provide one or more status bits indicating when or if an operation performed on the device is completed successfully. After initiating an operation, one or more of these status bits are polled for the indication of completion. If a memory device indicates failure of the operation, such as a read, write or erase operation, it may be desirable to deem the device as failed and to discontinue testing of the device rather than continue to write or erase potentially millions of device addresses after deeming the device as failed. This can be accommodated by exiting the tester pattern, disabling the device in tester hardware, and re-entering the tester pattern. However, this can be a time-consuming and disruptive process, thus adding to fabrication costs.

For the reasons stated above, and for other reasons stated below which will become apparent to those skilled in the art upon reading and understanding the present specification, there is a need in the art for alternate operation modes and integrated circuit devices supporting such operation modes beneficial to device testing.

SUMMARY OF THE INVENTION

The above-mentioned problems with memory devices and other problems are addressed by the present invention and will be understood by reading and studying the following specification.

Output driver stages and operation modes are described herein for selectively disabling outputs of an integrated circuit device, and particularly a memory device, by selectively disabling one or more output drivers. Such output driver stages and operation modes are generally independent of the device architecture. An inhibit signal is provided having a first logic level to facilitate normal operation of the output drivers responsive to a global output enable signal and having a second logic level to disable the output drivers regardless of the global output enable signal. The inhibit signal may be provided directly to one or more output drivers. Alternatively, the inhibit signal may be combined with the global output enable signal. The inhibit signal may be common to all coupled output drivers or a separate inhibit signal may be provided for each such output driver. Selective disabling of output drivers can be used to force a device time-out during testing. Selective disabling of output drivers can also be used to reduce device power requirements.

Various embodiments are adapted to selectively disable the outputs of a memory device without adversely affecting timing characteristics or other operations of the memory device. As an example, despite having an output disabled in accordance with the various embodiments, a memory device may still write to or erase a memory cell, and may still read from a memory cell, albeit without providing the data value on the disabled output.

For one embodiment, the invention provides an integrated circuit device. The device includes a plurality of output drivers including at least one first output driver and at least one second output driver and a logic circuit for providing a first control signal. Each first output driver is responsive to a second control signal when the first control signal has a first logic level and is disabled when the first control signal has a second logic level, regardless of a logic level of the second control signal. Each second output driver is responsive to the second control signal regardless of a logic level of the first control signal.

For another embodiment, the invention provides an integrated circuit device. The device includes a logic circuit for providing at least two first control signals, at least two first output drivers and at least one second output driver. Each first output driver is associated with one of the first control signals. In addition, each first output driver is responsive to a second control signal when its associated first control signal has a first logic level and is disabled when its associated first control signal has a second logic level, regardless of a logic level of the second control signal. Each second output driver is responsive to the second control signal regardless of a logic level of any of the first control signals.

For one embodiment, the invention provides a memory device. The memory device includes a logic circuit for providing an inhibit signal and an output driver stage having at least one output driver. Each output driver is responsive to a global output enable signal when the inhibit signal has a first logic level. Each output driver is disabled when the inhibit signal has a second logic level, regardless of a logic level of the global output enable signal.

For another embodiment, the invention provides a memory device. The memory device includes a logic circuit for providing an inhibit signal and an output driver stage having at least one output driver coupled to receive a global output enable signal on a first control node and the inhibit signal on a second control node. Each output driver is responsive to the global output enable signal when the inhibit signal has a first logic level. Each output driver is disabled when the inhibit signal has a second logic level, regardless of a logic level of the global output enable signal.

For yet another embodiment, the invention provides a method of operating a memory device. The method includes combining an inhibit signal with a global output enable signal, thereby producing a local output enable signal. The method further includes applying the local output enable signal to a control node of at least one output driver of the memory device. The local output enable signal has a logic level indicative of a logic level of the global output enable signal when the inhibit signal has a first logic level. The local output enable signal has a logic level independent of the logic level of the global output enable signal when the inhibit signal has a second logic level.

For still another embodiment, the invention provides a method of operating a memory device. The method includes combining an inhibit signal with a global output enable signal, thereby producing a local output enable signal, and applying the local output enable signal to a control node of at least one output driver of the memory device. The method further includes permitting normal operation of each at least one output driver responsive to a logic level of the global output enable signal when the inhibit signal has a first logic level. The method still further includes disabling each at least one output driver when the inhibit signal has a second logic level regardless of the logic level of the global output enable signal.

For a further embodiment, the invention provides a method of operating a memory device. The method includes latching a mask in a logic circuit for providing a plurality of inhibit signals, providing a global output enable signal to first control nodes of a plurality of output drivers of the memory device, and providing the plurality of inhibit signals to second control nodes of the plurality of output drivers in a one-to-one relationship. The method further includes permitting normal operation of an output driver responsive to a logic level of the global output enable signal when the inhibit signal associated with the output driver has a first logic level. The method still further includes disabling an output driver when the inhibit signal associated with the output driver has a second logic level regardless of the logic level of the global output enable signal.

For a still further embodiment, the invention provides a method of testing a memory device. The method includes tri-stating a first portion of output drivers of the memory device in response to detecting a failure of an access operation on the memory device and permitting normal operation of the remaining output drivers while the first portion of output drivers is tri-stated.

For another embodiment, the invention provides a method of testing a memory device. The method includes tri-stating a first portion of output drivers of the memory device corresponding to "don't care" bits and permitting normal operation of the remaining output drivers while the first portion of output drivers is tri-stated.

For yet another embodiment, the invention provides a method of testing a memory device. The method includes performing an access operation on the memory device and detecting a failure of the access operation. The method further includes providing an inhibit signal to a first portion of output drivers of the memory device subsequent to detecting the failure of the access operation, thereby tri-stating each output driver of the first portion of output drivers. The method still further includes isolating a remaining portion of output drivers of the memory device from the inhibit signal and polling at least one output driver of the remaining portion of output drivers for a ready condition. The method still further includes attempting to access at least one output driver of the tri-stated first portion of output drivers subsequent to detecting the ready condition.

The invention further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Figure 1:
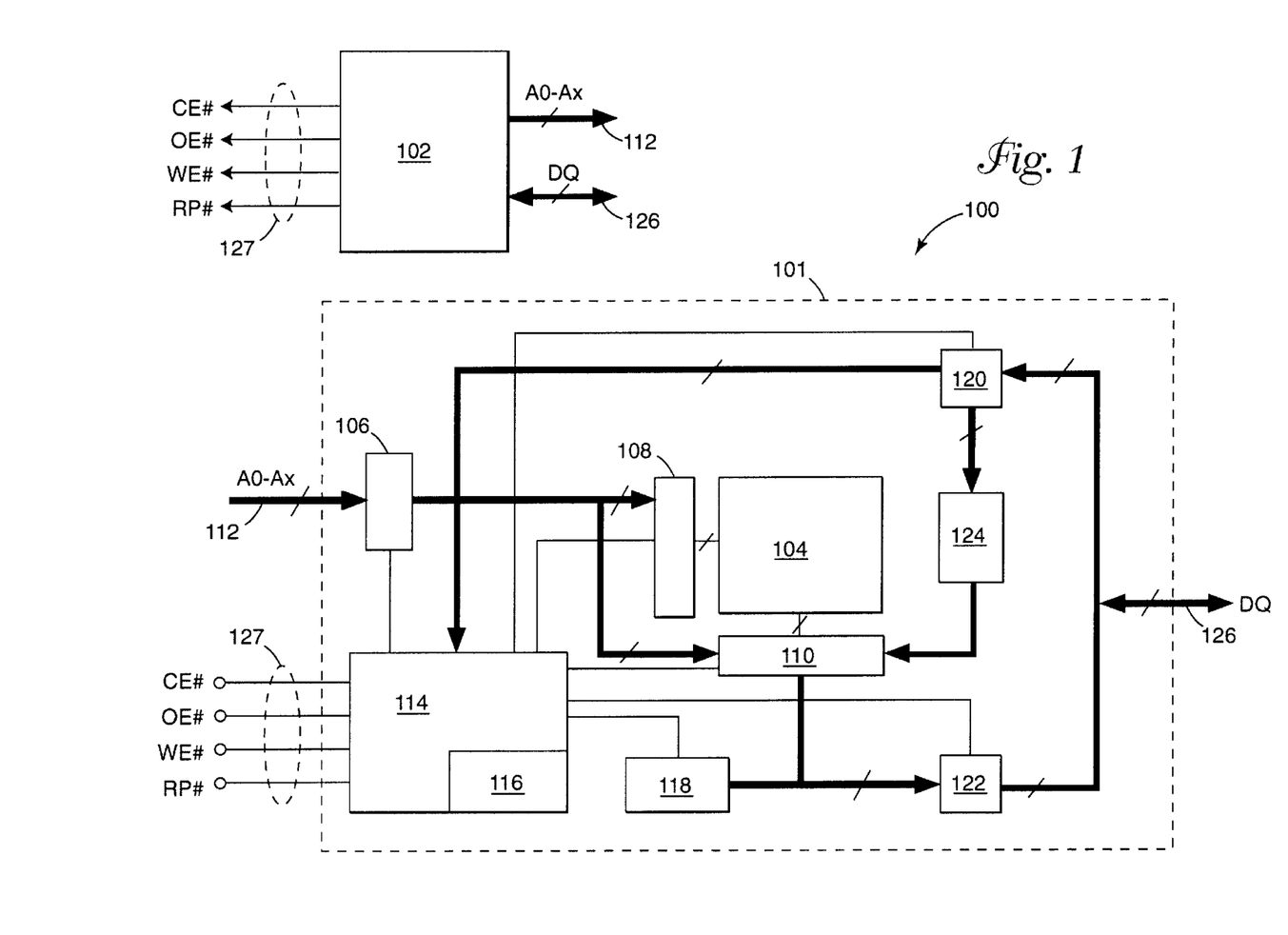
FIG. 1 is a block diagram of a memory device coupled to a processor.

FIG. 1 illustrates a block diagram of a memory device 101 in accordance with one embodiment of the invention. The memory device 101 may be fabricated as an integrated circuit or semiconductor device on a semiconductor die of a semiconductor wafer. FIG. 1 further shows that the memory device 101 may be coupled to a processor 102 to form part of an electronic system 100. Examples of electronic systems 100 include such systems as computer systems, peripheral devices, cellular and wireless devices, digital cameras, audio recorders, personal digital assistants (PDAs) and test equipment. For one embodiment, the processor 102 may be part of a testing system or tester hardware with the memory device 101 being the device under test (DUT). For this embodiment, the processor 102 provides address signals, data signals and control signals to the memory device 101 through multiple leads acting as address lines, data lines and control lines. Regardless of whether the memory device 101 is an active component of the electronic system 100 or a device under test in the electronic system 100, the processor 102 may be coupled to more than one memory device 101.

The memory device 101 has been simplified to focus on features of the memory that are helpful in understanding the present invention. The memory device 101 includes a memory array 104. The memory cells (not shown) of the memory array 104 may be nonvolatile floating-gate memory cells, such as in a flash memory device. Row access circuitry 108 and column access circuitry 110 are provided to decode address signals provided on address lines A0–Ax 112 and to provide access to the memory cells of the memory array 104 in response to the decoded address signals. An address buffer circuit 106 is provided to latch the externally-applied address signals prior to decoding. Data input 120 and output 122 buffer/driver circuits are included for bi-directional data communication over a plurality of data (DQ) lines 126 with the processor 102. A data latch 124 is typically provided between input buffer/driver circuit 120 and the memory array 104 for storing data values (to be written to a memory cell) received from the DQ lines 126.

Command control circuit 114 decodes control signals provided on control lines 127 from the processor 102. These control signals are used to control the operations on the memory array 104, including data read, data write, and erase operations. A test mode logic circuit 116 is included in the memory device 101 and may be a part of the command control circuit 114. The test mode logic circuit 116 initiates and controls testing functions internal to the memory device in response to a pattern, sequence or potential level of one or more of the control signals.

A status register 118 provides the one or more status bits indicative of the status of the memory device 101. As stated above, the memory device 101 has been simplified to facilitate a basic understanding of the features of the memory. A more detailed understanding of typical flash memories is known to those skilled in the art.

During erase or write operations on a memory device of the type described above, a processor issues a command or command sequence to initiate the operation. The processor then polls the status register for completion of the operation. If the memory device fails the operation, it may continue to return back a fail status indefinitely upon accessing subsequent location addresses. In such situations, it may be desirable to disable the memory device to preclude further testing.

Various embodiments of the invention provide for selectively disabling device outputs. Disabling device outputs can be used to cause a device to time out, thus permitting a testing system to avoid further testing of the memory device. Disabling device outputs can also be used to increase the parallelism supported by the testing system. As an example, disabling one or more device outputs reduces the power requirements of driving each memory device, thus permitting more memory devices to be tested concurrently without increasing the power demand of the testing system.

An output driver, as used with the various embodiments of the invention, provides an output signal having a potential level or other state that is indicative of an input signal when the output driver is enabled and independent of the input signal when the output driver is disabled. Output drivers are typically tri-state devices, presenting either a first potential level, a second potential level or a high-impedance state. Output drivers are generally tri-stated when disabled, thus presenting the high-impedance state.

Figure 2A:
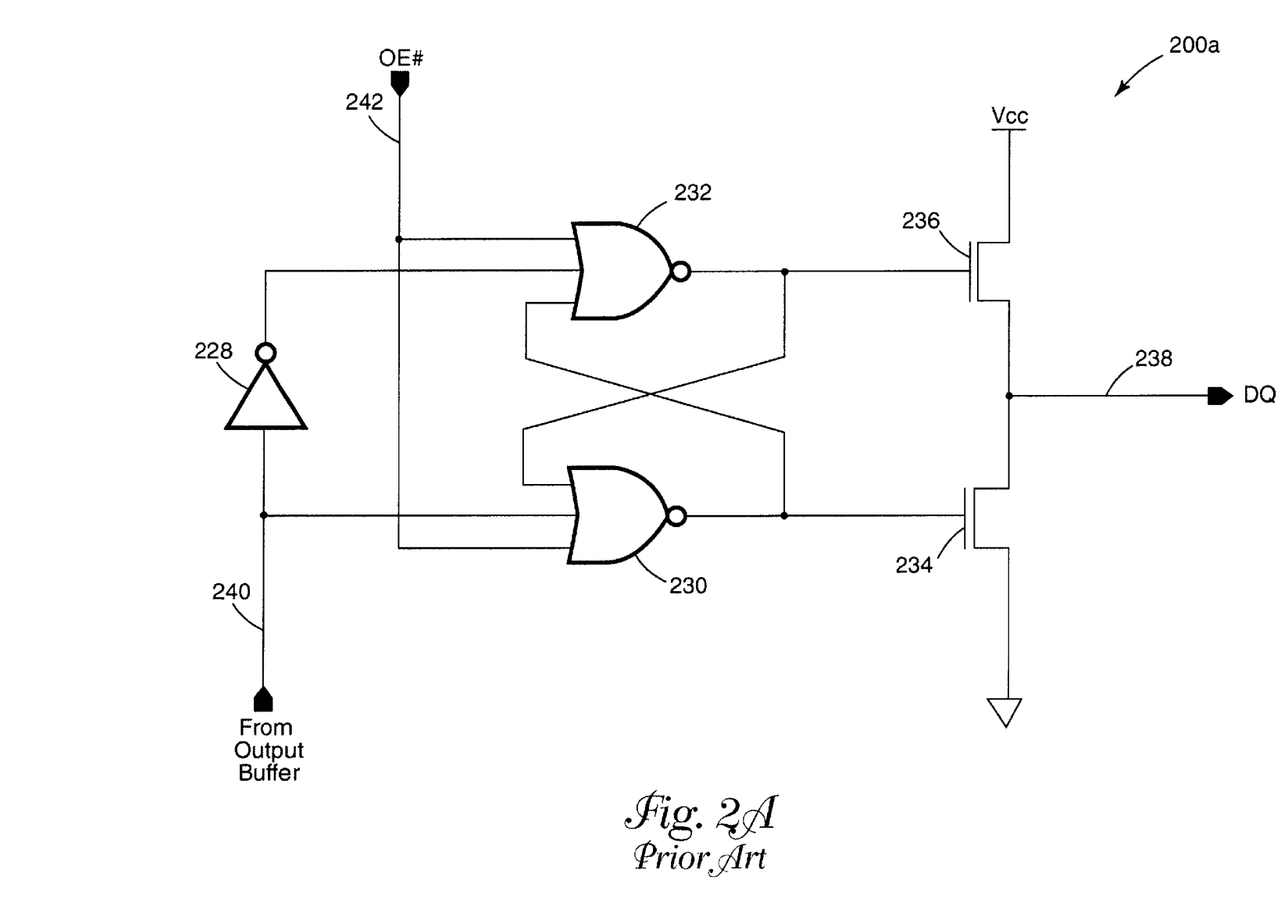
FIG. 2A is a schematic of an output driver coupled to receive an output enable signal.

FIG. 2A is a schematic of a simple output driver 200a. As shown in FIG. 2A, the output driver 200a receives an input signal at input node 240, such as from the output buffer of a memory device. The input signal is supplied to a first NOR gate 230. The input signal is further inverted with inverter 228 and supplied to a second NOR gate 232. The NOR gates 230 and 232 are cross coupled, each having their output supplied as an input to the other NOR gate. An output enable signal is further supplied to each NOR gate 230 and 232 through control node 242. The output enable signal is a control signal having a first logic level for enabling the output driver 200a and a second logic level for disabling the output driver 200a. In this configuration, the logic levels of the NOR gates 230 and 232 will be indicative of the logic level of the input signal when the output enable signal has the first logic level, in this case logic low, and the logic levels of the NOR gates 230 and 232 will be independent of the logic level of the input signal when the output enable signal has the second logic level, in this case logic high.

The outputs of the NOR gates 230 and 232 are coupled to gates of the NMOS transistors 234 and 236, respectively. As such, when the output driver 200a is enabled, the output signal on output node 238 will have a first potential level, e.g., Vcc, when the input signal is logic high and a second potential level, e.g., a ground potential, when the input signal is logic low. Likewise, when the output driver 200a is disabled, node 238 will present a high-impedance state.

While the output driver 200a is representative of a basic output driver, other output drivers are known in the art. Variations may be used with various embodiments provided the output driver's output signal is indicative of the input signal when the output enable signal has a first logic level and is independent of the input signal when the output enable signal has a second logic level. It is noted that the output enable signal may represent a combination of control signals to provide for additional modes of operation.

Figure 2B:
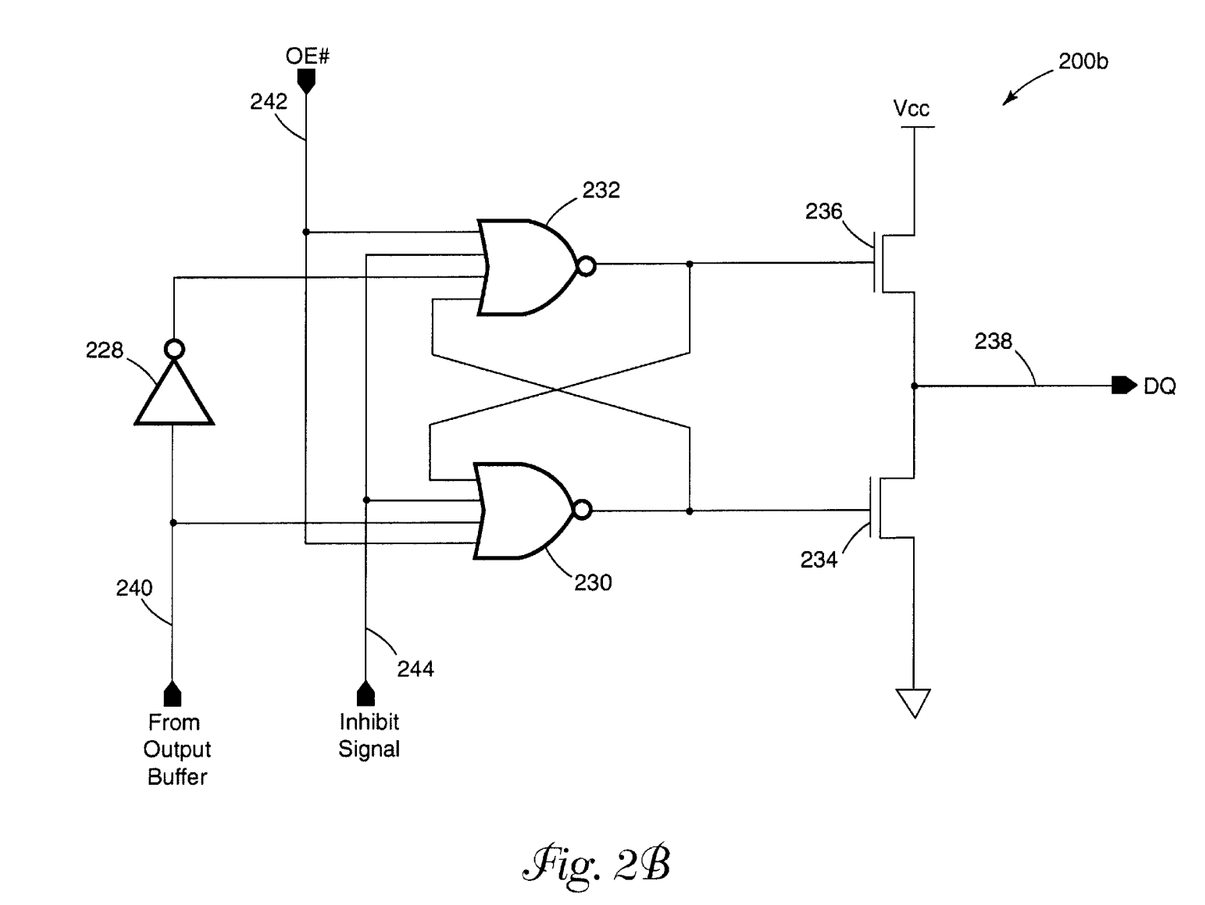
FIG. 2B is a schematic of an output driver coupled to receive an output enable signal and an inhibit signal in accordance with an embodiment of the invention.

FIG. 2B is a schematic of an output driver 200b. As depicted in FIG. 2B, the output driver 200b is similar to the output driver 200a with an added control signal. The added control signal is an inhibit signal provided at control node 244 and supplied to the inputs of the NOR gates 230 and 232. As with the output driver 200a, the output signal of the output driver 200b is indicative of the input signal when the output enable signal has a first logic level and is independent of the input signal when the output enable signal has a second logic level. The output driver 200b is capable of normal operation, i.e., responsive to the input signal and the output enable signal, when the inhibit signal has a first logic level, in this case logic low. The output driver 200b is disabled and presents a high-impedance state, regardless of the logic levels of the input signal and output enable signal, when the inhibit signal has a second logic level, in this case logic high. Variations of an output driver accepting an output enable signal and an inhibit signal may be used with various embodiments provided the output driver's output signal is indicative of the input signal when the output enable signal has a first logic level and is independent of the input signal when the output enable signal has a second logic level, and provided the output driver is capable of normal operation when the inhibit signal has a first logic level and is disabled when the inhibit signal has a second logic level. It is noted that the output enable signal and/or the inhibit signal may represent combinations of control signals to provide for additional modes of operation.

Figure 3:
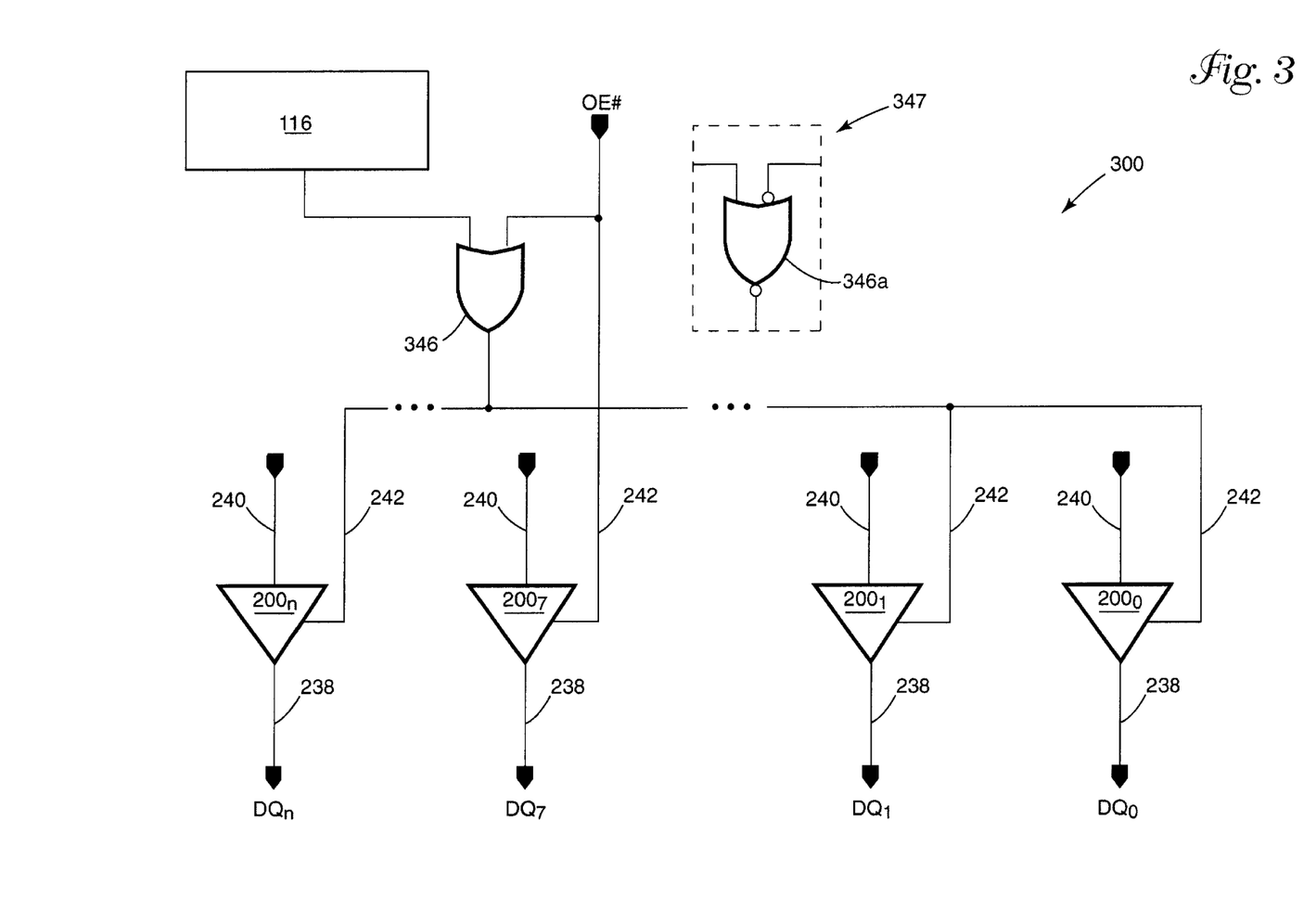
FIG. 3 is a schematic of an output driver stage in accordance with an embodiment of the invention.

FIG. 3 is a schematic of an output driver stage 300 in accordance with an embodiment of the invention. The output driver stage 300 includes one or more output drivers $200_0$–$200_n$, each output driver 200 coupled to receive an input signal on a node 240 and to provide an output signal on a node 238. Each output driver 200 is further coupled to receive a local output enable signal on a control node 242. As shown in FIG. 3, the output driver $200_7$ receives its local output enable signal as the control signal OE#, a global output enable signal. The remaining output drivers 200 receive their local output enable signals from the logic block 346. The logic block 346 is coupled to receive an inhibit signal from the test mode logic circuit 116 or other logic circuit as a first input and the global output enable signal as a second input.

The logic block 346 may be an OR gate, as shown, to facilitate providing a local output enable signal having a logic high level regardless of the logic level of the global output enable signal. Alternatively, the logic block 346 may be a NOR gate 346a having an inverted second input, such as depicted in inset 347. By inverting the second input of the NOR gate 346a, i.e., inverting the global output enable signal, the logic block may be made to provide a local output enable signal having a logic low level regardless of the logic level of the global output enable signal. In either case, the logic block 346 will provide a local output enable signal having the same logic level as the global output enable signal when the inhibit signal is indicative of normal operation. Other logic blocks may be used provided each coupled output driver 200 is capable of normal operation when the inhibit signal has a first logic level, and is disabled when the inhibit signal has a second logic level. The appropriate logic block is generally dependent on the logic level of the local output enable signal required to disable the output driver 200.

For the output driver stage 300, at least one output driver 200 is coupled to receive a local output enable signal that is a combination of a global output enable signal and an inhibit signal, such as output drivers $200_0$, $200_1$ and $200_n$. Such output drivers 200 are capable of normal operation responsive to the global output enable signal when the inhibit signal has a first logic level and are disabled when the inhibit signal has a second logic level. Optionally, one or more output drivers 200 are coupled to receive the global output enable signal as their local output enable signals, such as output driver $200_7$. Such output drivers 200 are capable of normal operation regardless of the logic level of the inhibit signal. For one embodiment, each output driver 200 of the output driver stage 300 is coupled to receive a local output enable signal that is a combination of the global output enable signal and the inhibit signal.

Embodiments such as depicted in FIG. 3 facilitate selective disabling of a predetermined set of output drivers of the output driver stage, while permitting normal operation of any remaining output drivers. As an example, in an 8-bit status register, a ready/busy bit indicative of completion of an access operation may be presented on DQ7. An output driver stage as depicted in FIG. 3 will facilitate active polling of this ready/busy bit without driving the remaining data outputs.

For one embodiment, permitting live output of the ready/busy bit and tri-stating the remaining DQ lines can be used to force a device time-out during testing of a memory device. In principle, the ready/busy bit is polled to detect a ready condition. Upon detecting the ready condition, the outputs of all output drivers are accessed by the testing system. The testing system will time-out the memory device in response to the attempted access of the tri-stated output drivers as no data will be present despite detecting the ready condition. In addition, where less than all status or data bits are of interest during testing, the "don't care" bits can be selectively disabled to simply reduce the power requirements of the testing system, thus permitting concurrent testing of a larger number of memory devices.

Figure 4:
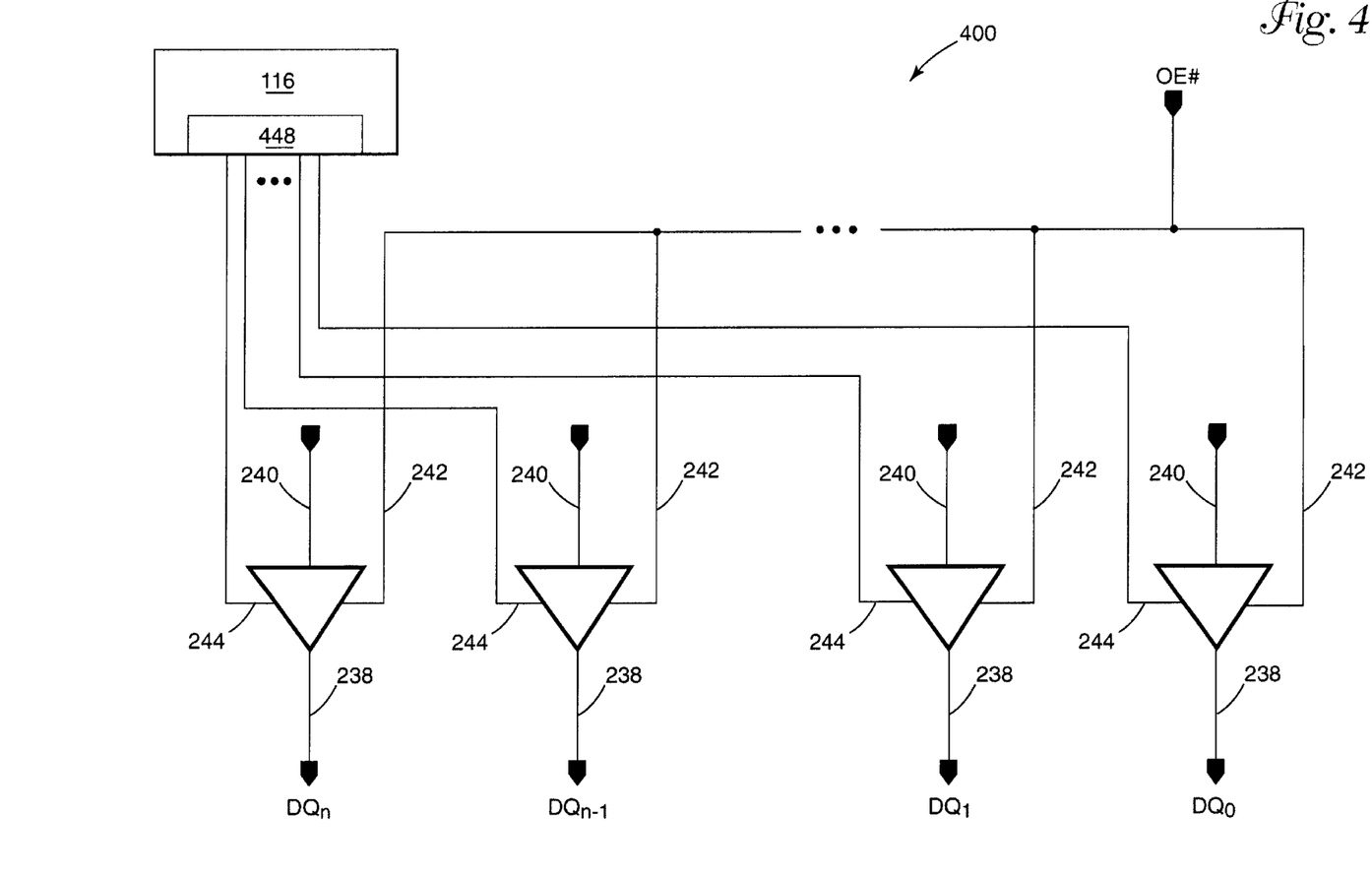
FIG. 4 is a schematic of an output driver stage in accordance with another embodiment of the invention.

FIG. 4 is a schematic of an output driver stage 400 in accordance with another embodiment of the invention. The output driver stage 400 includes one or more output drivers $200_0$–$200_n$, each output driver 200 coupled to receive an input signal on a node 240 and to provide an output signal on a node 238. Each output driver 200 is further coupled to receive a local output enable signal on a control node 242 and an inhibit signal on a control node 244. As shown in FIG. 4, the output drivers 200 are coupled to receive the global output enable signal as their local output enable signals. The output drivers 200 are further coupled to receive their inhibit signal from a latch 448 of the test mode logic circuit 116 or other logic circuit.

The latch 448 provides a separate inhibit signal to each output driver 200. By loading the latch 448 with a mask, the appropriate inhibit signal may be provided to a predetermined set of one or more output drivers 200 to selectively disable this set of output drivers 200. Remaining output drivers 200 of the output driver stage 400 will be capable of normal operation. The latch 448 may be a fuse bank or other non-volatile data register to facilitate permanent or long-term storage of the mask. Alternatively, the latch 448 may be a volatile data register.

Figure 5:
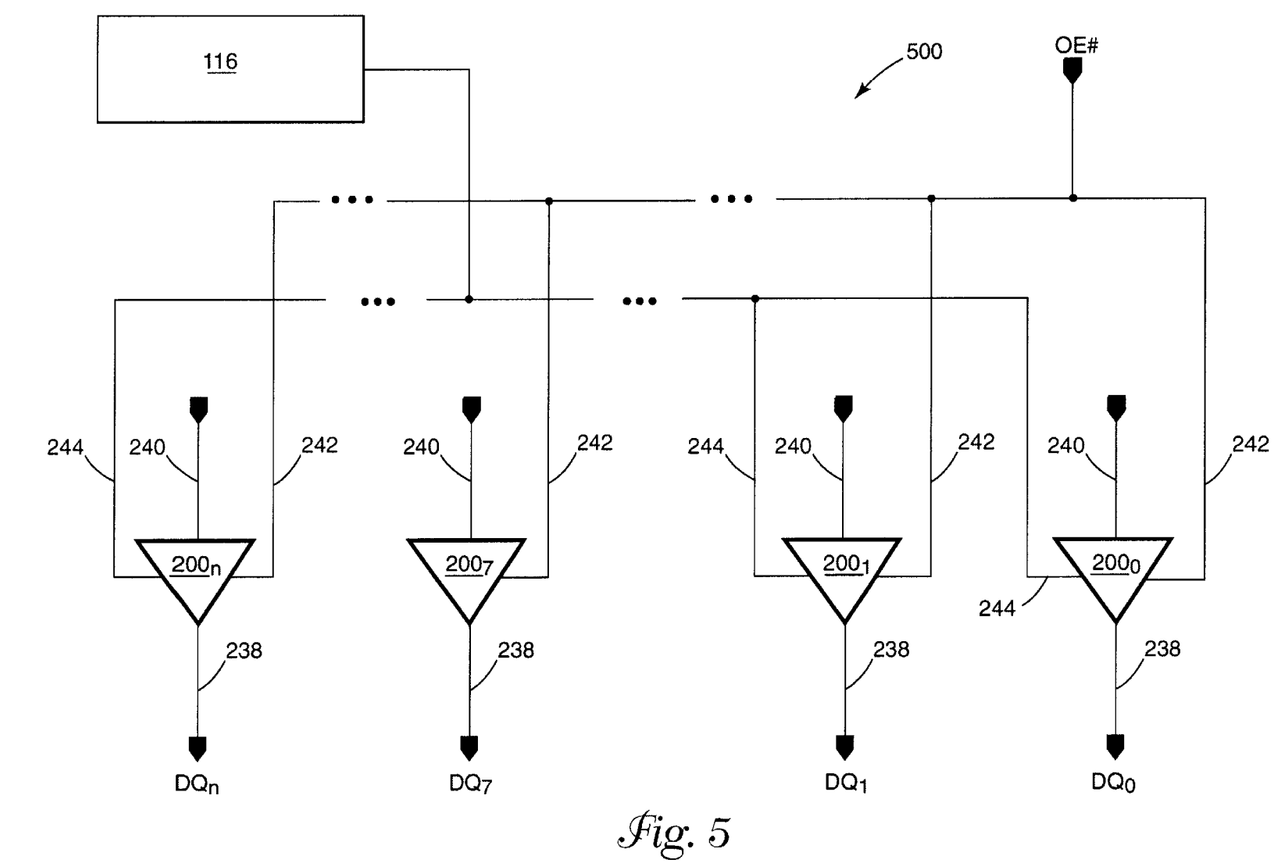
FIG. 5 is a schematic of an output driver stage in accordance with yet another embodiment of the invention.

FIG. 5 is a schematic of an output driver stage 500 in accordance with yet another embodiment of the invention. The output driver stage 500 includes one or more output drivers $200_0$–$200_n$, each output driver 200 coupled to receive an input signal on a node 240 and to provide an output signal on a node 238. Each output driver 200 is further coupled to receive a local output enable signal on a control node 242. As shown in FIG. 5, each output driver 200 is coupled to receive the global output enable signal as its local output enable. At least one output driver 200 is further coupled to receive an inhibit signal on a control node 244, such as output drivers $200_0$, $200_1$, and $200_n$. The inhibit signal is received from the test mode logic circuit 116 or other logic circuit. Such output drivers 200 are capable of normal operation responsive to the global output enable signal when the inhibit signal has a first logic level and are disabled when the inhibit signal has a second logic level. Optionally, one or more output drivers 200 are isolated from the inhibit signal, such as output driver $200_7$. Such output drivers 200 are capable of normal operation regardless of the logic level of the inhibit signal. Embodiments such as depicted in FIG. 5 facilitate selective disabling of a predetermined set of output drivers of the output driver stage, while permitting normal operation of any remaining output drivers. For one embodiment, each output driver 200 of the output driver stage 500 is coupled to receive the inhibit signal.

Figure 6:
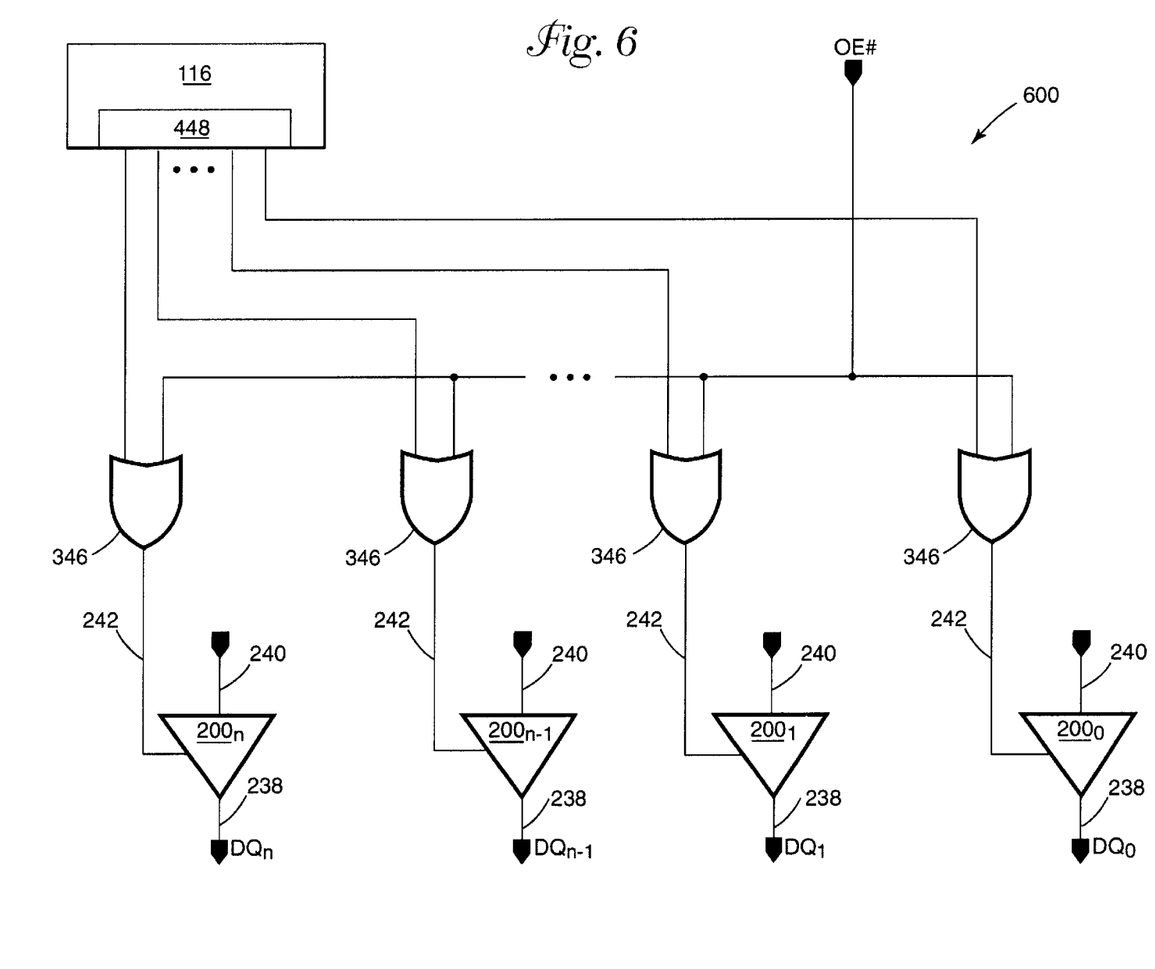
FIG. 6 is a schematic of an output driver stage in accordance with still another embodiment of the invention.

FIG. 6 is a schematic of an output driver stage 600 in accordance with still another embodiment of the invention. The output driver stage 600 includes one or more output drivers $200_0$–$200_n$, each output driver 200 coupled to receive an input signal on a node 240 and to provide an output signal on a node 238. Each output driver 200 is further coupled to receive a local output enable signal on a control node 242. Each local output enable signal is received from a respective logic block 346. Each logic block 346 is coupled to receive an inhibit signal from a latch 448 of the test mode logic circuit 116 or other logic circuit as a first input and the global output enable signal as a second input. Each logic block 346 provides a local output enable signal that is a combination of the received inhibit signal and the global output enable signal. The appropriate logic block is generally dependent on the logic level of the local output enable signal required to disable the output driver 200.

The latch 448 provides a separate inhibit signal to each logic block 346. By loading the latch 448 with a mask, the appropriate inhibit signal may be provided to a predetermined set of one or more logic blocks 346 to selectively disable their respective set of output drivers 200. Remaining output drivers 200 of the output driver stage 400 will be capable of normal operation. The latch 448 may be a fuse bank or other non-volatile data register to facilitate permanent or long-term storage of the mask. Alternatively, the latch 448 may be a volatile data register.

Figure 7:
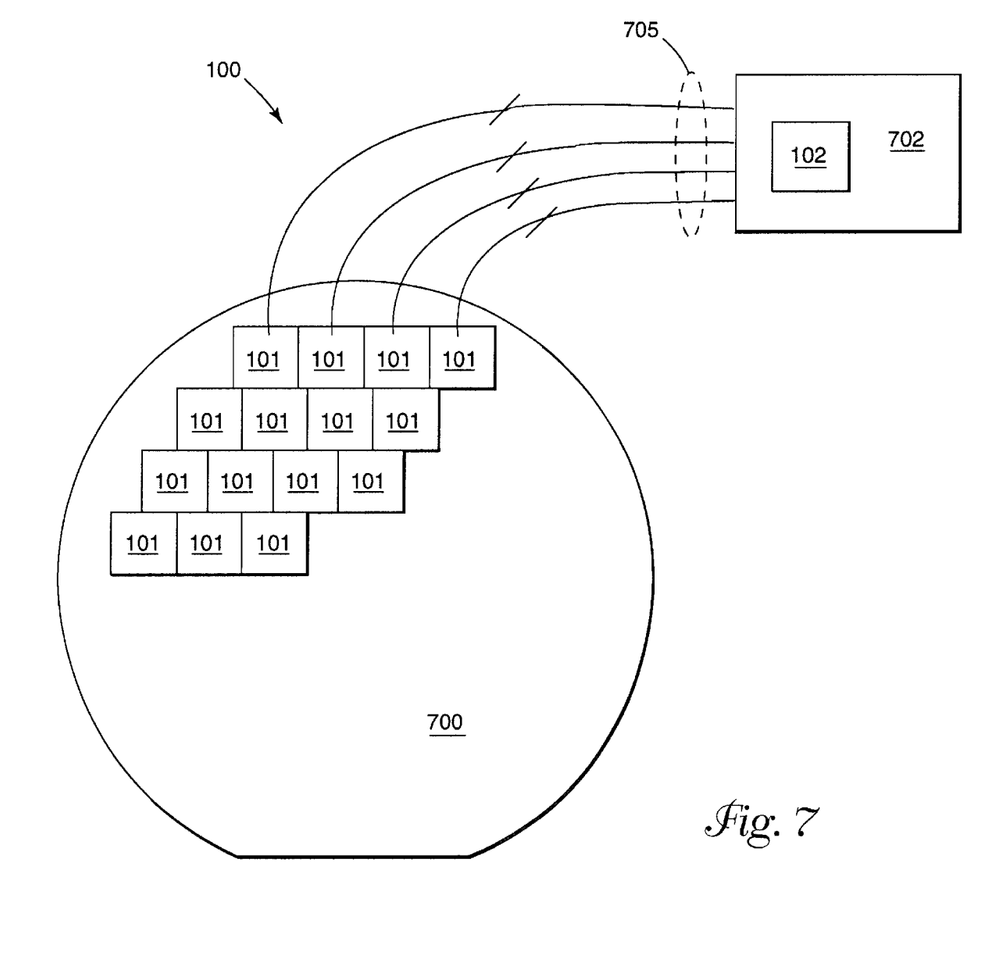
FIG. 7 is a block diagram of an electronic system as a testing system in accordance with an embodiment of the invention.

FIG. 7 is a block diagram of an electronic system 100 as a testing system for performing testing on one or more memory devices 101. The testing system includes tester hardware 702 including a processor 102. The tester hardware 702 is coupled to one or more memory devices 101 and can be used to test multiple memory devices 101 in parallel or in sequence. The tester hardware 702 is coupled to each memory device 101 using sets of leads 705 serving as address lines, DQ lines and control lines for the processor 102. Coupling of the tester hardware 702 to the memory devices 101 may be accomplished using a set of leads 705 coupled to the address lines, DQ lines and control lines on each memory device 101. The sets of leads 705 may be individually applied to each memory device 101 or they may be grouped to apply multiple leads substantially simultaneously. As shown in FIG. 7, testing may be performed prior to dicing the memory devices 101 from a semiconductor wafer 700, such that each memory device 101 is an undiced semiconductor die. Alternatively, testing may be performed in a like manner subsequent to dicing and/or packaging of each memory device 101 by coupling the sets of leads 705 to the appropriate lines of each memory device 101 through the pins, bumps or other connectors of the diced or packaged memory device. Common component packaging includes industry-standard FBGA (fine-pitch ball grid array) packages and industry-standard TSOP (thin small-outline package) packages.

A test mode logic circuit of each memory device 101 is responsive to one or more control signals from the tester hardware 702 to determine whether to generate an inhibit signal capable of disabling one or more output drivers. The tester hardware 702 may provide such control signals to a memory device 101 in response to detecting a failure condition of the memory device 101. Alternatively, the tester hardware 702 may provide such control signals to the memory device 101 simply to disable one or more output drivers regardless of detecting a failure condition. As an example, output drivers corresponding to "don't care" bits may be disabled merely to reduce power requirements of the memory device 101 during testing or other modes of operation.

CONCLUSION

Output driver stages and operation modes have been described for selectively disabling outputs of an integrated circuit device, and particularly a memory device, by selectively disabling one or more output drivers. Such output driver stages and operation modes are generally independent of the device architecture. An inhibit signal is provided having a first logic level to facilitate normal operation of the output drivers responsive to a global output enable signal and having a second logic level to disable the output drivers regardless of the global output enable signal. The inhibit signal may be provided directly to one or more output drivers. Alternatively, the inhibit signal may be combined with the global output enable signal. The inhibit signal may be common to all coupled output drivers or a separate inhibit signal may be provided for each output driver.

Selective disabling of output drivers can be especially beneficial during device testing. Device testing may include performing an access operation of the integrated circuit device, polling the device and detecting whether the access operation failed. When a failure is detected, a control signal can be generated to disable one or more device outputs. Subsequent polling of the device can force a time-out of the tester hardware in response to the disabled output, prompting the tester hardware to discontinue further testing of the failed device. Additionally, a control signal can be generated to disable one or more device outputs regardless of device failure if the outputs correspond to "don't care" bits, or bits whose data value can be ignored during operation, Disabling device outputs for "don't care" bits reduces the device power requirements. Reducing device power requirements during testing allows the tester hardware to test larger numbers of devices in parallel.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An integrated circuit device, comprising:
a plurality of output drivers including at least one first output driver and at least one second output driver; and
a logic circuit for providing a first control signal;
wherein each at least one first output driver is responsive to a second control signal when the first control signal has a first logic level;
wherein each at least one first output driver is disabled when the first control signal has a second logic level, regardless of a logic level of the second control signal; and
wherein each at least one second output driver is responsive to the second control signal regardless of a logic level of the first control signal.

2. The integrated circuit device of claim 1, wherein the plurality of output drivers is a plurality of data output drivers.

3. The integrated circuit device of claim 2, wherein the plurality of data output drivers belong to a single output driver stage.

4. The integrated circuit device of claim 1, wherein each at least one first output driver is coupled to receive both the first control signal and the second control signal.

5. The integrated circuit device of claim 1, further comprising a logic block for combining the first control signal and the second control signal to generate a third control signal, wherein each at least one first output driver is coupled to receive the third control signal.

6. The integrated circuit device of claim 5, wherein the logic block is an OR gate.

7. An integrated circuit device, comprising:
a logic circuit for providing a first control signal;
at least one first output driver, each having a first control node coupled to receive the first control signal and a second control node coupled to receive a second control signal; and
at least one second output driver, each having a single control node coupled to receive the second control signal.

8. An integrated circuit device, comprising:
an output driver stage having at least one first output driver and at least one second output driver; and
a logic circuit for providing a first control signal;
wherein each at least one first output driver has a first control node coupled to receive the first control signal and a second control node coupled to receive a second control signal; and
wherein each at least one second output driver has a single control node coupled to receive the second control signal.

9. An integrated circuit device, comprising:
a logic circuit for providing a first control signal;
a logic block having a first input coupled to receive the first control signal, a second input coupled to receive a second control signal, and an output for providing a third control signal;
at least one first output driver, each having a control node coupled to receive the third control signal; and
at least one second output driver, each having a control node coupled to receive the second control signal.

10. An integrated circuit device, comprising:
a plurality of output drivers including at least one first output driver and at least one second output driver;
a logic circuit for providing a first control signal; and
a logic block coupled to receive the first control signal on a first input and a second control signal on a second input and to provide a third control signal on an output;
wherein each at least one first output driver is responsive to the third control signal; and
wherein each at least one second output driver is responsive to the second control signal.

11. An integrated circuit device, comprising:
a logic circuit for providing at least two first control signals;
at least two first output drivers, each associated with one of the first control signals; and
at least one second output driver;
wherein each of the at least two first output drivers is responsive to a second control signal when its associated first control signal has a first logic level;
wherein each of the at least two first output drivers is disabled when its associated first control signal has a second logic level, regardless of a logic level of the second control signal; and
wherein each at least one second output driver is responsive to the second control signal regardless of a logic level of any of the first control signals.

12. An integrated circuit device, comprising:
a logic circuit for providing a plurality of first control signals; and
a plurality of output drivers each having a first control node coupled to receive one of the first control signals and a second control node coupled to receive a second control signal;
wherein each output driver is responsive to the second control signal when its associated first control signal has a first logic level; and
wherein each output driver is disabled when its associated first control signal has a second logic level, regardless of a logic level of the second control signal.

13. An integrated circuit device, comprising:
a logic circuit for providing at least two first control signals;
at least two logic blocks each having a first input for receiving one of the first control signals, a second input for receiving a second control signal, and an output for providing a third control signal;
at least one first output driver each having a control node coupled to receive one of the third control signals; and
at least one second output driver each having a control node coupled to receive the second control signal.

14. A memory device, comprising:
a logic circuit for providing an inhibit signal; and
an output driver stage having at least one output driver;
wherein the at least one output driver is responsive to a global output enable signal when the inhibit signal has a first logic level; and
wherein the at least one output driver is disabled when the inhibit signal has a second logic level, regardless of a logic level of the global output enable signal.

15. The memory device of claim 14, wherein the output driver stage further comprises at least one second output driver responsive to the global output enable signal regardless of a logic level of the inhibit signal.

16. The memory device of claim 14, wherein the global output enable signal is a combination of control signals.

17. The memory device of claim 14, wherein the output driver provides an output signal indicative of a logic level of an input signal when the global output enable signal has a first logic level and the output driver is disabled when the global output enable signal has a second logic level.

18. The memory device of claim 14, wherein the first logic level is a logic low level and the second logic level is a logic high level.

19. The memory device of claim 18, wherein the logic low level is represented by a ground potential and the logic high level is represented by a supply potential.

20. A memory device, comprising:
a logic circuit for providing an inhibit signal; and
an output driver stage having at least one output driver, wherein the at least one output driver is coupled to receive a global output enable signal on a first control node and the inhibit signal on a second control node;
wherein the at least one output driver is responsive to the global output enable signal when the inhibit signal has a first logic level; and
wherein the at least one output driver is disabled when the inhibit signal has a second logic level, regardless of a logic level of the global output enable signal.

21. The memory device of claim 20, wherein the output driver stage further comprises at least one second output driver isolated from the inhibit signal and responsive to the global output enable signal.

22. A memory device, comprising:
a logic circuit for providing an inhibit signal;
a logic block coupled to receive the inhibit signal on a first input and a global output enable signal on a second input and to provide a local output enable signal on an output; and
an output driver having a control node coupled to receive the local output enable signal, an input coupled to receive an input signal, and an output for providing an output signal;
wherein the output driver is responsive to the local output enable signal to provide an output signal indicative of the input signal when the local output enable signal has a first logic level and to present a high-impedance state on its output when the local output enable signal has a second logic level; and
wherein a logic level of the local output enable signal is indicative of a logic level of the global output enable signal when the inhibit signal has a first logic level and the logic level of the local output enable signal is independent of the logic level of the global output enable signal when the inhibit signal has a second logic level.

23. The memory device of claim 22, wherein the logic block is selected from the group consisting of an OR gate and a NOR gate having an inverted second input.

24. A memory device, comprising:
a logic circuit for providing a plurality of inhibit signals; and
an output driver stage having a plurality of output drivers, wherein at least two output drivers are coupled to receive a global output enable signal on a first control node and one of the inhibit signals on a second control node;
wherein each of the at least two output drivers is responsive to the global output enable signal when its inhibit signal has a first logic level; and
wherein each of the at least two output drivers is disabled when its inhibit signal has a second logic level, regardless of a logic level of the global output enable signal.

25. The memory device of claim 24, wherein the logic circuit further comprises a latch for providing the plurality of inhibit signals.

26. The memory device of claim 25, wherein the latch is selected from the group consisting of a fuse bank, a non-volatile register and a volatile register.

27. The memory device of claim 25, wherein the latch stores a mask for disabling a predetermined set of the at least two output drivers.

28. The memory device of claim 27, wherein the predetermined set of the at least two output drivers correspond to "don't care" bits.

29. A memory device, comprising:
a logic circuit for providing a plurality of inhibit signals;
a plurality of logic blocks each coupled to receive one of the inhibit signals on a first input and a global output enable signal on a second input and to provide a local output enable signal on an output; and
at least two output drivers, each having a control node coupled to receive a local output enable signal from one of the logic blocks, an input coupled to receive an input signal, and an output for providing an output signal;
wherein each output driver is responsive to its local output enable signal to provide an output signal indicative of its input signal when its local output enable signal has a first logic level and to present a high-impedance state on its output when its local output enable signal has a second logic level; and
wherein a logic level of a local output enable signal is indicative of a logic level of the global output enable signal when its respective inhibit signal has a first logic level and a logic level of a local output enable signal is independent of the logic level of the global output enable signal when its respective inhibit signal has a second logic level.

30. The memory device of claim 29, wherein the logic circuit further comprises a latch for providing the plurality of inhibit signals.

31. A memory device, comprising:
a logic circuit for providing an inhibit signal;
a logic block coupled to receive the inhibit signal on a first input and a global output enable signal on a second input and to provide a local output enable signal on an output; and
a plurality of output drivers each having an input, an output and a control node;
wherein at least one of the output drivers is coupled to receive the local output enable signal on its control node.

32. The memory device of claim 31, wherein the logic block is selected from the group consisting of an OR gate and a NOR gate having an inverted second input.

33. The memory device of claim 31, wherein one of the output drivers is coupled to receive the global output enable signal on its control node and all remaining output drivers are coupled to receive the local output enable signal on their control nodes.

34. A memory device, comprising:
a logic circuit for providing an inhibit signal;
a logic block coupled to receive the inhibit signal on a first input and a global output enable signal on a second input and to provide a local output enable signal on an output; and
a plurality of output drivers each having an input, an output and a control node;
wherein at least one of the output drivers is coupled to receive the local output enable signal on its control node; and wherein at least one of the output drivers is coupled to receive the global output enable signal on its control node.

35. A memory device, comprising:
a logic circuit having a latch for providing a plurality of inhibit signals; and
a plurality of output drivers each having an input, an output, a first control node and a second control node; wherein the first control node of each output driver is coupled to receive a global output enable signal; and wherein the second control node of each output driver is coupled to receive one of the plurality of inhibit signals.

36. A memory device, comprising:
a logic circuit for providing an inhibit signal; and
a plurality of output drivers each having an input, an output, a first control node and a second control node; wherein the first control node of each output driver is coupled to receive a global output enable signal; and wherein the second control node of each output driver is coupled to receive the inhibit signal.

37. A memory device, comprising:
a logic circuit for providing an inhibit signal;
at least one first output driver each having an input, an output, a first control node and a second control node;
at least one second output driver each having an input, an output, and a first control node;
wherein the first control node of each output driver is coupled to receive a global output enable signal; and wherein the second control node of each first output driver is coupled to receive the inhibit signal.

38. The memory device of claim 37, wherein each at least one second output driver is isolated from the inhibit signal.

39. A memory device, comprising:
a logic circuit having a latch for providing a plurality of inhibit signals;
a plurality of logic blocks each having a first input for receiving one of the inhibit signals, a second input for receiving a global output enable signal, and an output for providing a local output enable signal; and
a plurality of output drivers each having an input, an output, and control node coupled to receive one of the local output enable signals.

40. A method of operating a memory device, comprising:
combining an inhibit signal with a global output enable signal, thereby producing a local output enable signal; and
applying the local output enable signal to a control node of at least one output driver of the memory device;
wherein the local output enable signal has a logic level indicative of a logic level of the global output enable signal when the inhibit signal has a first logic level; and
wherein the local output enable signal has a logic level independent of the logic level of the global output enable signal when the inhibit signal has a second logic level.

41. The method of claim 40, wherein combining the inhibit signal with the global output enable signal comprises OR-ing the inhibit signal and the global output enable signal.

42. The method of claim 40, wherein combining the inhibit signal with the global output enable signal comprises inverting the global output enable signal and NOR-ing the inhibit signal and the inverted global output enable signal.

43. The method of claim 40, wherein the inhibit signal has the first logic level during a first operation mode of the memory device and wherein the inhibit signal has the second logic level during another operation mode of the memory device.

44. The method of claim 43, wherein the first operation mode of the memory device is a normal mode of operation and wherein the other operation mode of the memory device is a test mode of operation.

45. The method of claim 44, wherein the inhibit signal assumes the second logic level in response to detecting a failure of an access operation of the memory device during the test mode.

46. The method of claim 45, wherein the access operation is selected from the group consisting of a read operation, a write operation and an erase operation.

47. A method of operating a memory device, comprising:
combining an inhibit signal with a global output enable signal, thereby producing a local output enable signal;
applying the local output enable signal to a control node of at least one output driver of the memory device;
permitting normal operation of each at least one output driver responsive to a logic level of the global output enable signal when the inhibit signal has a first logic level; and
disabling each at least one output driver when the inhibit signal has a second logic level regardless of the logic level of the global output enable signal.

48. The method of claim 47, wherein disabling each at least one output driver comprises tri-stating each at least one output driver.

49. The method of claim 47, wherein disabling each at least one output driver occurs prior to permitting normal operation of each at least one output driver.

50. A method of operating a memory device, comprising:
combining an inhibit signal with a global output enable signal, thereby producing a local output enable signal;
applying the local output enable signal to a control node of at least one first output driver of the memory device;
applying the global output enable signal to a control node of at least one second output driver of the memory device;
permitting normal operation of each at least one second output driver responsive to a logic level of the global output enable signal regardless of a logic level of the inhibit signal;
permitting normal operation of each at least one first output driver responsive to a logic level of the global output enable signal when the inhibit signal has a first logic level; and
disabling each at least one first output driver when the inhibit signal has a second logic level regardless of the logic level of the global output enable signal.

51. The method of claim 50, wherein the method proceeds in the order presented.

52. A method of operating a memory device, comprising:
latching a mask in a test mode logic circuit for providing a plurality of inhibit signals;
providing a global output enable signal to first control nodes of a plurality of output drivers of the memory device;
providing the plurality of inhibit signals to second control nodes of the plurality of output drivers in a one-to-one relationship;
permitting normal operation of an output driver responsive to a logic level of the global output enable signal when the inhibit signal associated with the output driver has a first logic level; and disabling an output driver when the inhibit signal associated with the output driver has a second logic level regardless of the logic level of the global output enable signal.

53. The method of claim 52, wherein the method proceeds in the order presented.

54. A method of operating a memory device, comprising:
providing a global output enable signal to first control nodes of a plurality of output drivers of the memory device;
providing an inhibit signal to second control nodes of the plurality of output drivers;
permitting normal operation of an output driver responsive to a logic level of the global output enable signal when the inhibit signal associated with the output driver has a first logic level; and
disabling an output driver when the inhibit signal associated with the output driver has a second logic level regardless of the logic level of the global output enable signal.

55. The method of claim 54, wherein the method proceeds in the order presented.

56. A method of operating a memory device, comprising:
providing a global output enable signal to first control nodes of a plurality of output drivers of the memory device;
providing an inhibit signal to second control nodes of a first portion of the plurality of output drivers;
permitting normal operation of an output driver of a remaining portion of the plurality of output drivers responsive to a logic level of the global output enable signal regardless of a logic level of the inhibit signal;
permitting normal operation of an output driver of the first portion of the plurality of output drivers responsive to a logic level of the global output enable signal when the inhibit signal associated with the output driver has a first logic level; and
disabling an output driver when the inhibit signal associated with the output driver has a second logic level regardless of the logic level of the global output enable signal.

57. The method of claim 56, further comprising isolating the remaining portion of the plurality of output drivers from the inhibit signal.

58. The method of claim 56, wherein the method proceeds in the order presented.

59. A method of operating a memory device, comprising:
latching a mask in a logic circuit for providing a plurality of inhibit signals;
providing the plurality of inhibit signals to first inputs of a plurality of logic blocks in a one-to-one relationship;
providing a global output enable signal to second inputs of the plurality of logic blocks;
combining an inhibit signal and the global output enable signal in each logic block, thereby producing a plurality of local output enable signals;
providing a local output enable signal to a control node of each of a plurality of output drivers in a one-to-one relationship;
permitting normal operation of an output driver responsive to a logic level of the global output enable signal when the inhibit signal associated with the output driver has a first logic level; and
disabling an output driver when the inhibit signal associated with the output driver has a second logic level regardless of the logic level of the global output enable signal.

60. The method of claim 59, wherein the method proceeds in the order presented.

61. A method of operating a memory device, comprising:
latching a mask in a logic circuit for providing a plurality of inhibit signals;
providing the plurality of inhibit signals to first inputs of a plurality of logic blocks in a one-to-one relationship;
providing a global output enable signal to second inputs of the plurality of logic blocks;
combining an inhibit signal and the global output enable signal in each logic block, thereby producing a plurality of local output enable signals;
providing a local output enable signal to a control node of each of a plurality of output drivers in a one-to-one relationship;
wherein each local output enable signal has a logic level indicative of a logic level of the global output enable signal when the inhibit signal associated with the local output enable signal has a first logic level; and
wherein each local output enable signal has a logic level independent of the logic level of the global output enable signal when the inhibit signal associated with the local output enable signal has a second logic level.

62. The method of claim 61, wherein the method proceeds in the order presented.

63. An electronic system, comprising:
a processor; and
a memory device coupled to the processor, wherein the memory device comprises:
a logic circuit for providing an inhibit signal; and
an output driver stage having at least one output driver;
wherein the at least one output driver is responsive to a global output enable signal when the inhibit signal has a first logic level; and
wherein the at least one output driver is disabled when the inhibit signal has a second logic level, regardless of a logic level of the global output enable signal.

64. The electronic system of claim 63, wherein the processor is a part of a tester hardware for performing tests on the memory device and wherein a disabled output driver forces a time-out of the tester hardware during a test.

65. The electronic system of claim 63, wherein the electronic system is selected from the group consisting of a BIOS firmware, a peripheral device, a cellular device, a wireless device, a digital camera, a PDA, an audio recorder, and a flash memory card.

66. An electronic system, comprising:
a processor; and
a memory device coupled to the processor, wherein the memory device comprises:
a logic circuit for providing an inhibit signal; and
an output driver stage having at least one output driver,
wherein the at least one output driver is coupled to receive a global output enable signal on a first control node and the inhibit signal on a second control node;
wherein the at least one output driver is responsive to the global output enable signal when the inhibit signal has a first logic level; and
wherein the at least one output driver is disabled when the inhibit signal has a second logic level, regardless of a logic level of the global output enable signal.

67. A method of testing a memory device, comprising:
performing an access operation on the memory device;
detecting a failure of the access operation;
providing an inhibit signal to a first portion of output drivers of the memory device subsequent to detecting the failure of the access operation, thereby tri-stating each output driver of the first portion of output drivers;
isolating a remaining portion of output drivers of the memory device from the inhibit signal;
polling at least one output driver of the remaining portion of output drivers for a ready condition; and
attempting to access at least one output driver of the tri-stated first portion of output drivers subsequent to detecting the ready condition.

68. The method of claim 67, wherein the method is performed in parallel on at least two memory devices.

69. The method of claim 67, wherein the method is performed prior to dicing the memory device from a semiconductor wafer.

70. A method of testing a memory device having a plurality of output drivers, comprising:
tri-stating each output driver of a first portion of the plurality of output drivers in response to detecting a failure of an access operation on the memory device; and
permitting normal operation of a remaining portion of the plurality of output drivers while the first portion of the plurality of output drivers is tri-stated.

71. The method of claim 70, further comprising:
attempting to access a tri-stated output driver of the first portion of the plurality of output drivers;
forcing a time-out in response to attempting to access the tri-state output driver; and
discontinuing further testing of the memory device in response to the time-out.

72. A method of testing a memory device having a plurality of output drivers, comprising:
tri-stating each output driver of a first portion of the plurality of output drivers corresponding to "don't care" bits; and
permitting normal operation of a remaining portion of the plurality of output drivers.

73. A method of testing a memory device, comprising:
performing an access operation on the memory device;
detecting a failure of the access operation; and
providing an inhibit signal to at least one output driver of the memory device subsequent to detecting the failure of the access operation.

74. The method of claim 73, further comprising:
detecting a ready condition of the memory device subsequent to detecting the failure of the access operation; and
attempting to access the at least one output driver subsequent to detecting the ready condition.

75. The method of claim 73, further comprising:
tri-stating the at least one output driver in response to the inhibit signal.

76. The method of claim 73, further comprising:
tri-stating the at least one output driver in response to the inhibit signal;
detecting a ready condition of the memory device subsequent to detecting the failure of the access operation;
attempting to access the at least one tri-stated output driver subsequent to detecting the ready condition; and
forcing a time-out in response to attempting to access the at least one tri-stated output driver subsequent to detecting the ready condition.

77. The method of claim 73, wherein the method proceeds in the order presented.

78. A method of testing a memory device, comprising:
performing an access operation on the memory device;
detecting a failure of the access operation;
providing an inhibit signal to at least one output driver of the memory device subsequent to detecting the failure of the access operation, thereby tri-stating each at least one output driver;
polling a status register of the memory device to detect a ready condition; and
attempting to access the at least one tri-stated output driver subsequent to detecting the ready condition.

79. The method of claim 78, wherein the method proceeds in the order presented.

80. A method of testing a memory device, comprising:
performing a write operation on the memory device;
detecting a failure of the write operation;
providing an inhibit signal to a first portion of output drivers of the memory device subsequent to detecting the failure of the write operation, thereby tri-stating each output driver of the first portion of output drivers;
isolating a remaining portion of output drivers of the memory device from the inhibit signal;
polling a ready/busy bit of a status register of the memory device to detect a ready condition; and
attempting to access the first portion of output drivers subsequent to detecting the ready condition.

81. The method of claim 80, wherein the method proceeds in the order presented.

82. An output driver stage, comprising:
a first control node for receiving a first control signal;
a second control node for receiving a second control signal;
an input node for receiving an input signal; and
an output node for providing an output signal;
wherein the output signal is responsive to the first control signal and the input signal when the second control signal has a first logic level; and
wherein the output signal is disabled regardless of the first control signal and the input signal when the second control signal has a second logic level.

83. The output driver stage of claim 82, further wherein the output signal is disabled when the first control signal has a first logic level and the output signal is indicative of a logic level of the input signal when the first control signal has a second logic level.

84. The output driver stage of claim 83, wherein the first logic level of the first control signal is the same logic level as the first logic level of the second control signal.

85. The output driver stage of claim 82, wherein the output node presents a high-impedance state when the output signal is disabled.

86. An electronic system, comprising:
a tester hardware having a processor and at least one set of leads; and
at least one memory device each coupled to the tester hardware through a set of leads, each memory device comprising:
a test mode logic circuit for providing an inhibit signal; and an output driver stage having at least one output driver;
wherein the at least one output driver is responsive to a global output enable signal when the inhibit signal has a first logic level;
wherein the at least one output driver is disabled when the inhibit signal has a second logic level, regardless of a logic level of the global output enable signal; and
wherein the inhibit signal assumes the second logic level in response to at least one control signal from the tester hardware.

87. The electronic system of claim 86, wherein each memory device is a packaged component.

88. The electronic system of claim 86, wherein each memory device is an undiced semiconductor die.

89. The electronic system of claim 86, wherein each set of leads has leads that are individually coupled to a memory device.

90. The electronic system of claim 86, wherein each set of leads has leads that are coupled to a memory device substantially simultaneously.

91. An electronic system, comprising:
a tester hardware having a processor and at least one set of leads; and
at least one memory device each coupled to the tester hardware through a set of leads, each memory device comprising:
a test mode logic circuit for providing a plurality of inhibit signals; and
an output driver stage having a plurality of output drivers, wherein at least two output drivers are coupled to receive a global output enable signal on a first control node and one of the inhibit signals on a second control node;
wherein each of the at least two output drivers is responsive to the global output enable signal when its inhibit signal has a first logic level;
wherein each of the at least two output drivers is disabled when its inhibit signal has a second logic level, regardless of a logic level of the global output enable signal; and
wherein an inhibit signal assumes the second logic level in response to at least one control signal from the tester hardware.

92. The electronic system of claim 91, wherein each memory device is coupled to the tester hardware after dicing and packaging.

93. The electronic system of claim 91, wherein each memory device is coupled to the tester hardware prior to dicing.

94. The electronic system of claim 91, wherein each set of leads has leads that are grouped to be coupled to a memory device substantially simultaneously.

95. An electronic system, comprising:
a tester hardware having a processor and at least one set of leads; and
at least one memory device each coupled to the tester hardware through a set of leads, each memory device comprising:
a test mode logic circuit for providing an inhibit signal responsive to the tester hardware;
a logic block coupled to receive the inhibit signal on a first input and a global output enable signal on a second input and to provide a local output enable signal on an output; and
a plurality of output drivers each having an input, an output and a control node;
wherein at least one of the output drivers is coupled to receive the local output enable signal on its control node.

96. The electronic system of claim 95, wherein each memory device is coupled to the tester hardware after dicing and packaging.

97. The electronic system of claim 95, wherein each memory device is coupled to the tester hardware prior to dicing.

* * * * *